(12) United States Patent
Ngo

(10) Patent No.: US 8,461,815 B1
(45) Date of Patent: Jun. 11, 2013

(54) FAST TRANSIENT BUCK REGULATOR WITH DYNAMIC CHARGE/DISCHARGE CAPABILITY

(76) Inventor: Huy X Ngo, Fremont, CA (US)

(*) Notice: Subject to any disclaimer, the term of this patent is extended or adjusted under 35 U.S.C. 154(b) by 338 days.

(21) Appl. No.: 12/889,217

(22) Filed: Sep. 23, 2010

Related U.S. Application Data

(60) Provisional application No. 61/278,107, filed on Oct. 5, 2009, provisional application No. 61/278,108, filed on Oct. 5, 2009, provisional application No. 61/278,109, filed on Oct. 5, 2009, provisional application No. 61/278,127, filed on Oct. 5, 2009, provisional application No. 61/278,128, filed on Oct. 5, 2009, provisional application No. 61/278,129, filed on Oct. 5, 2009.

(51) Int. Cl.
*G05F 1/56* (2006.01)
(52) U.S. Cl.
USPC .......................................... 323/271; 323/284
(58) Field of Classification Search
USPC .... 323/222, 224, 271, 272, 282–288; 363/16, 363/17, 21.12, 21.14, 21.16
See application file for complete search history.

(56) References Cited

U.S. PATENT DOCUMENTS

| | | | |
|---|---|---|---|
| 5,912,552 A * | 6/1999 | Tateishi | 323/285 |
| 6,310,469 B1 | 10/2001 | Bentolila et al. | |
| 7,012,415 B2 * | 3/2006 | Moraveji | 323/315 |
| 7,061,213 B2 | 6/2006 | Yoshida | |
| 7,173,403 B1 | 2/2007 | Chen et al. | |
| 7,262,588 B2 * | 8/2007 | Matsuo et al. | 323/282 |
| 7,675,276 B2 | 3/2010 | Ohkawa et al. | |
| 7,733,072 B2 * | 6/2010 | Kanakubo | 323/271 |
| 2005/0057238 A1 | 3/2005 | Yoshida | |
| 2008/0130325 A1 | 6/2008 | Ye | |
| 2009/0079410 A1 | 3/2009 | Ohkawa et al. | |
| 2009/0102444 A1 | 4/2009 | Nonaka | |
| 2009/0315523 A1 | 12/2009 | Kumagai et al. | |
| 2010/0066328 A1 | 3/2010 | Shimizu et al. | |
| 2010/0102788 A1 | 4/2010 | Kuroyabu | |

OTHER PUBLICATIONS

Applicant's prior art figure 1B.*

* cited by examiner

*Primary Examiner* — Rajnikant Patel
(74) *Attorney, Agent, or Firm* — Tran & Associates

(57) ABSTRACT

Systems and methods are disclosed to control a buck converter with a first switching circuit including a first upper power transistor coupled to a first lower power transistor at a first junction; a second switching circuit including a second upper power transistor coupled to a second lower power transistor at a second junction; an inductor coupled to the first and second junctions; and a load coupled to the second junction.

18 Claims, 6 Drawing Sheets

FAST TRANSIENT BUCK REGULATOR WITH DYNAMIC CHARGE/DISCHARGE CAPABILITY

This application claims priority to U.S. Provisional Application Ser. Nos. 61/278,107; 61/278,108; 61/278,109; 61/278,127; 61/278,128; and 61/278,129, all of which were filed on Oct. 5, 2009, the contents of which are incorporated by reference.

BACKGROUND

The present invention relates to a fast transient buck regulator with dynamic charge/discharge capability.

Switching regulators are commonly used to step-down a higher level, unregulated input voltage to a regulated output voltage. The simplest way to reduce a DC voltage is to use a voltage divider circuit, but voltage dividers waste energy, since they operate by bleeding off excess power as heat; also, output voltage isn't regulated (varies with input voltage). Other types of linear voltage regulators tend to be inefficient. Often, the power devices used in linear voltage regulators must dissipate a large amount of power. Consequently, the linear regulators must be cooled, either by mounting them on heat-sinks or by forced-air cooling (e.g., a fan), resulting in the loss of efficiency. In applications where size and efficiency are critical, linear voltage regulators are generally not used.

In applications requiring DC-DC conversion from a relatively high input voltage, a switching regulator will dramatically improve conversion efficiency relative to linear regulator alternatives. A buck converter, or step-down switch mode power supply, may also be referred to as a switch mode regulator. Buck converters are often used to step down the voltage in a given circuit. Buck converters receive a high direct current (DC) voltage source and, accordingly, output a lower desired DC voltage. Popularity of the buck converter is due to its high efficiency and compact size. The buck converter can be used in place of bulky linear voltage regulators at high voltage inputs.

Conventional buck converters often can include one or more switches, which can be implemented by MOSFETs (Metal-Oxide-Semiconductor-Field-Effect-Transistors). The switches, which are commonly controlled by a multiphase oscillator, can alternate between connecting and disconnecting a voltage source to circuits that drive the desired output. Hence, the duty cycle of the switching determines the output voltage. In addition, a pulse-width modulation (PWM) circuit commonly controls the switching with each switch receiving a different phase of the PWM over the complete period of the oscillator frequency.

FIG. 1A shows an idealized block diagram of a conventional buck converter. A power source 10 such as a battery provides power to be converted. The converter includes an inductor 14 and two switches (usually a transistor 12 and a diode 16) that control the inductor 14. The switch alternates between connecting the inductor 14 to source voltage to store energy in the inductor 14 and discharging the inductor 14 into a load. The load can be modeled as a resistive part 20 and a capacitive part with Rc 22 and capacitor 24.

Buck converters can include multiple parallel channels to process one or more of the voltage sources to drive a common output. Each channel can be substantially similar and often includes at least one inductor. The input terminal of the inductor is switched between the voltage source and ground. The DC current through each inductor is proportional to the duty cycle of its PWM signal and the value of the voltage source.

Each inductor has a current limit. Typically, more PWM circuits are used when more output current is desired. The output terminals of all the inductors are electrically connected to provide a single output of the power conversion circuit. The output terminals of all the inductors are tied together and therefore have at least approximately identical voltages. The input terminal of each inductor has a rectangular wave voltage signal, which is derived from the voltage source and ground. The duty cycles of the rectangular wave voltage signals of respective channels are affected by variations in the respective PWM circuits and switches (e.g., design tolerances, offsets, and timing variations). A slight difference in the duty cycle can produce a significant difference in the DC current through the inductor in each channel.

U.S. Pat. No. 7,541,794 discusses a buck converter, having (i) an oscillator, (ii) a pulse width modulator, (iii) and a nonoverlap clock generator and level shifter. The buck converter can convert input voltage ranging from approximately 3V to 5V down to approximately 0.7-1.0V, 1.2V, 1.5V, 1.8V, 2.5V, and 3.3V without the use of resistor dividers.

FIG. 1B shows a conventional multi-phase converter. The circuit uses two or more sets of upper and lower switches each driving an inductor. Control signal HDRV1 112A controls the gate of Q1 212A with body diode D 143A, while control signal LDRV1 112B controls the gate of Q2 212B with body diode 143B. Correspondingly control signal HDRV2 114A controls the gate of Q3 214A with body diode D 153A, while control signal LDRV2 114B controls the gate of Q4 214B with body diode 153B. Inductor 114 is connected to the junction where Q1 212A, Q2 212B meets. Inductor 124 is connected to the junction where Q3 214A, Q4 214B meets. The other end of inductor 114 is connected to resistive load 120 and to capacitive load having Rc 122 and capacitor 124.

SUMMARY

In one aspect, systems and methods are disclosed to control a buck converter with a first switching circuit including a first upper power transistor coupled to a first lower power transistor at a first junction; a second switching circuit including a second upper power transistor coupled to a second lower power transistor at a second junction; an inductor coupled to the first and second junctions; and a load coupled to the second junction.

Implementations of the above aspect may include one or more of the following. The second upper power transistor turns on when an output voltage falls below a predetermined voltage. The second upper power transistor has an on time T determined by $$T = K1*Ic + K2*ILOAD + K3*(Vin-Vout) + K4*Rds2 + K5*Rds4 + K6*IL$$

where Ic is the output capacitor current; IL is the inductor current; K1,K2,K3,K4,K5,K6 are the gain factors; ILOAD is the load current; Rds2 is the total resistance from switching node to Vin and Rds4 is the total resistance from the switching node to ground.

The second lower power transistor turns on when an output voltage exceeds a predetermined voltage. The second switching circuit is activated with fewer switching cycles than the cycles of the first switching circuit. The first switching circuit handles higher current than the second switching circuit. The first and second switching circuits perform pseudo-multiphase Buck regulation requiring only one inductor regardless of the number of phases done in the Buck regulator. The inductor can be implemented on-chip. A first body diode can be connected to the first upper power transistor and a second body diode can be connected to the first lower power transistor. The second upper power transistor on time is closed to a peak inductor current to ensure a charging current at a load and wherein the second lower power transistor is closed to a valley current in the inductor to discharge current to ground and prevent negative current in the inductor in a discontinuous buck mode. The charging and discharging of the second upper and lower power transistors to simulate a capacitor with a capacitance of $$K1*Ic+K2*ILOAD+K3*(Vin-Vout)+K4*Rds2+K5*Rds4+K6*IL$$

where Ic is an output capacitor current; IL is an inductor current; K1,K2,K3,K4,K5,K6 are gain factors; ILOAD is a load current; Rds2 is a total resistance from switching node to Vin and Rds4 is a total resistance from the switching node to ground.

Advantages of the preferred embodiments may include one or more of the following. The digital controller implementation allows much greater flexibility and better utilization of switching power converters. The second switching circuit is small and they are activated for only a few cycles, so they allow smaller inductor to be used, which in turn allows quick response without high current ripple and voltage ripple. Further, the system can implement a pseudo multi-phase buck regulator requiring only one inductor rather than a plurality of inductors. Since inductors take up significant chip real estate, the pseudo four phase buck converter can be implemented with ease for monolithic implementation (especially for DrMos) and at a lower cost. Further, the current in a multiphase regulator can be balanced with precision.

The system provides a faster transient response due to the charge/discharge action of the second switching circuit with upper power transistor Q2 and lower power transistor Q4. The system works with a smaller output capacitor due to charge/discharge action of Q2 in the second switching circuit, thus reducing system cost. Q2 420 on time is closed to the peak current of inductor current to ensure the charging current go to the load, while Q4 420 on time is closed to the valley current of inductor current to ensure the discharging current to ground and help to prevent the negative current in the inductor when the buck goes to discontinuous mode. The charging/discharging operations make the pair Q2 420 and Q4 424 act as a pseudo capacitor with a capacitance value controlled by a controller, where the capacitance is proximately determined by:

$$K1*Ic+K2*ILOAD+K3*(Vin-Vout)+K4*Rds2+K5*Rds4+K6*IL$$

Ic is the output capacitor current; IL is the inductor current; K1,K2,K3,K4,K5,K6 are the gain factors; ILOAD is the load current; Rds2 is the total resistance from switching node to Vin and Rds4 is the total resistance from the switching node to ground.

In pseudo multi-phase mode, the system needs only 1 inductor versus N inductors. The multi-phase is achieved by over-sampling the Vout while keeping the same switching frequency.

DESCRIPTION

Figure 1A:
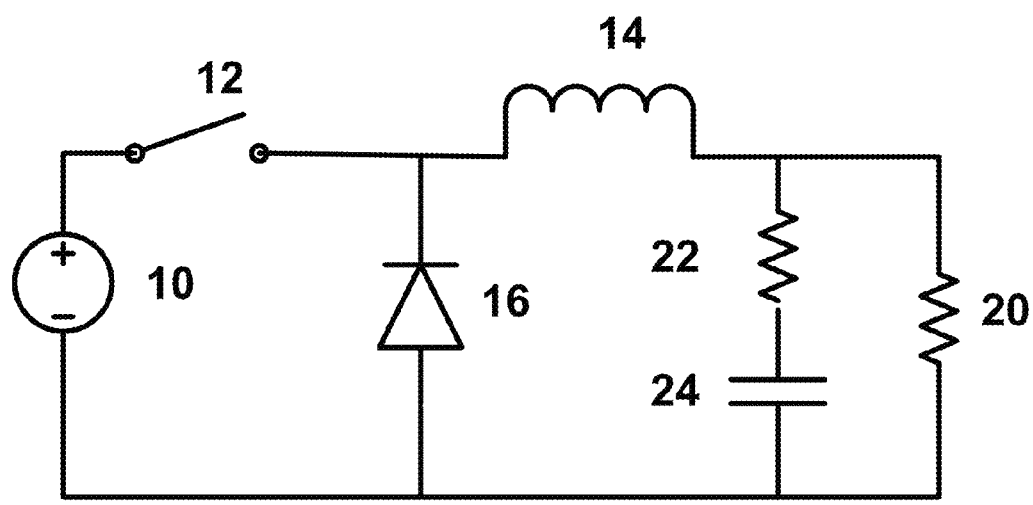
FIG. 1A shows a conventional buck converter.
Figure 1B:
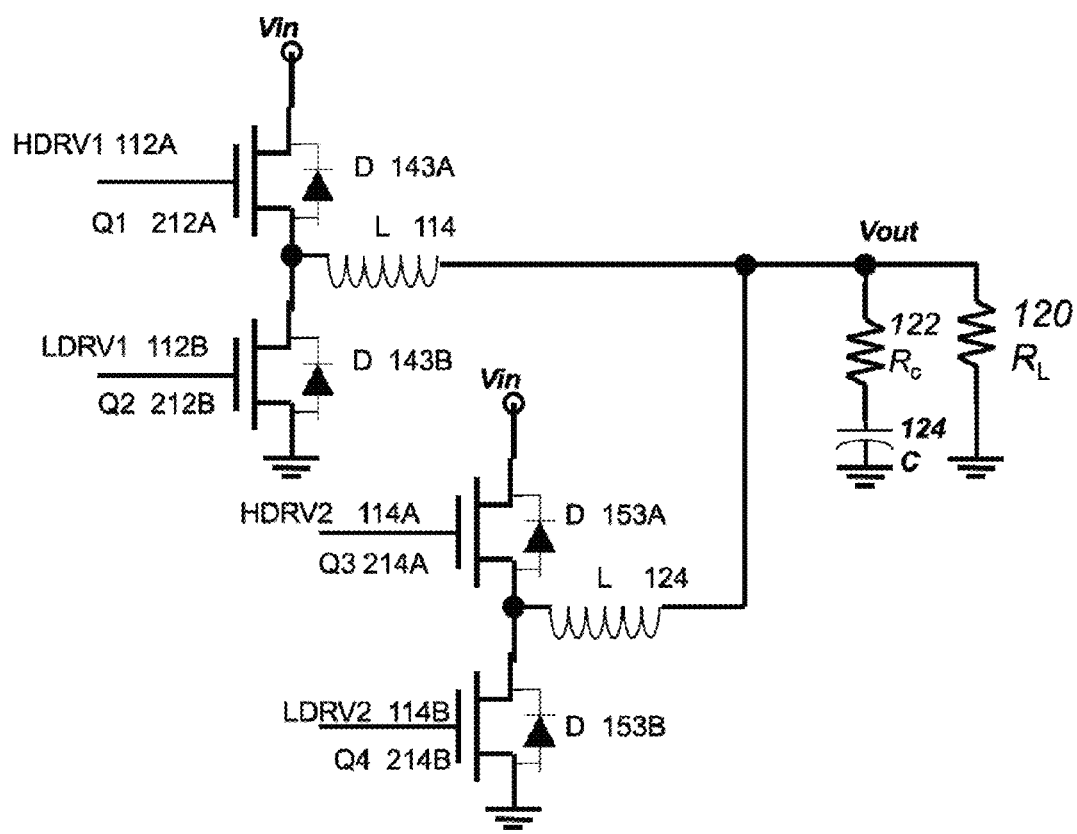
FIG. 1B shows a conventional multi-phase converter.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. In other instances, well-known features have not been described in detail to avoid obscuring the invention.

Figure 2:
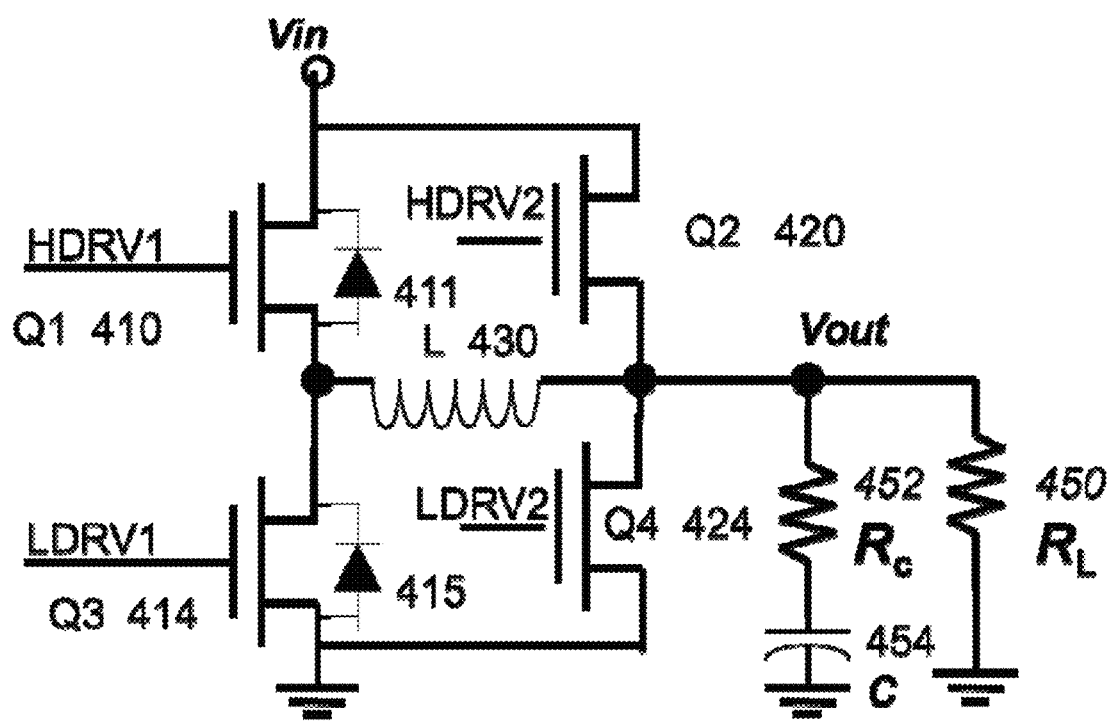
FIG. 2 shows a fast transient Buck regulator with dynamic charge or discharge circuit.

Turning now to FIG. 2, a fast transient Buck regulator with dynamic charge or discharge circuit is shown. The Buck regulator includes a first upper driver generating an HDRV1 signal to control power transistor Q1 410 and a first lower driver generating a LDRV1 signal to control power transistor Q2 414. A first body diode 411 is connected to the first upper power transistor Q1 410 and a second body diode 415 is connected to the first lower power transistor Q3 414.

The Buck regulator also includes a second upper driver generating an HDRV2 signal to control power transistor Q2 420 and a second lower driver generating a LDRV2 signal to control power transistor Q4 424. Inductor L 430 is positioned between the junctions of Q1 410 and Q3 414 and Q2 420 and Q4 424, respectively. The other end of inductor L 430 is connected to a resistive load 450 and to a capacitive load having resistor Rc 452 and capacitor C 454.

The Buck converter's transient response is dependent on inductor 430. A smaller inductor allows quicker response at the expense of high current ripple and high output voltage ripple. In the configuration of FIG. 2, when output voltage is dropped below a pre-defined level, Q2 420 is turned on to charge the capacitance quickly. The on time of Q2 is determined by T=K1*C/dV+K2*ILOAD where C is the capacitance value, dV is the output voltage drop, K1 and K2 are gain factors, and ILOAD is the load current. Depending on when Vout is sampled during the switching cycle, Q2 424 should be turned on farther way from the sample point so the on time can be calculated better.

The same principle is applied for Q4 424 which is turned on when the output voltage exceeds a pre-defined level. Because Q2 420 and Q4 424 are activated for a few switching cycles, these transistors can be small in size. Further, due to the small size, these transistors have no effect on the current and voltage ripple characteristics of the buck converter.

Figure 3:
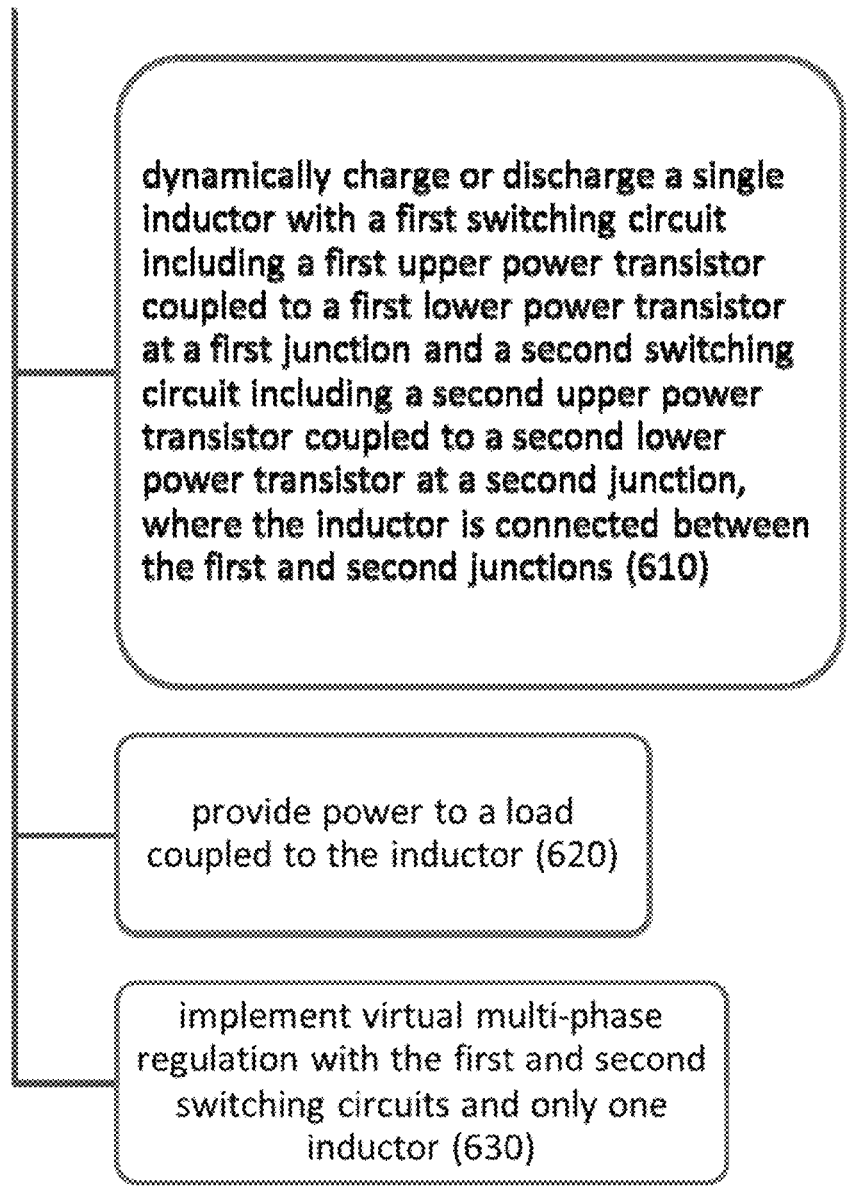
FIG. 3 shows an exemplary process to perform pseudo multiphase Buck regulation using one inductor.

The circuit of FIG. 2 can implement a pseudo multiphase digital Buck regulator as detailed next. FIG. 3 shows an exemplary process to perform pseudo multiphase Buck regulation using one inductor. The process dynamically charges or discharges one inductor with a first main switching circuit including a first upper power transistor coupled to a first lower power transistor at a first junction and a second smaller switching circuit including a second upper power transistor coupled to a second lower power transistor at a second junction, where the inductor is connected between the first and second junctions (610). The process then provides power to a load coupled to the inductor (620). The process can implement virtual multi-phase regulation with the first and second switching circuits and only one inductor (630).

In a traditional multiphase Buck converter, several pairs of transistors or switches are used and each transistor or switch is responsible for each phase of the multi-phase Buck regulator. In a pseudo multiphase configuration, there is only one main pair switch with the highest rating current (Q1 410, Q3

414) while the pair Q2 420 and Q4 424 is smaller and responsible for transient handling only. For a pseudo four-phase buck converter, Q1 and Q2 are switches at frequency of Fsw and Vout is sampled at 4Fsw.

The pseudo 4-phase buck regulator responds as fast as the traditional one but needs only one inductor with value L while the traditional one requires four inductors with value of L/4, so the inductor current ripple and output voltage ripple are the same. Since the Q2 and Q4 transistor pair offers equal or faster transient response than the Q1 and Q3 pair, the overall transient response of pseudo multiphase buck converter is equivalent of the traditional one.

The circuit of FIG. 2 provides a faster transient response due to the charge/discharge action of Q2 420 and Q4 424. The circuit works with a smaller output capacitor due to charge/discharge action of Q2 420 and Q4 424, thus reducing system cost. Q2 420 on time is closed to the peak current of inductor current to ensure the charging current go to the load, while Q4 420 on time is closed to the valley current of inductor current to ensure the discharging current to ground and help to prevent the negative current in the inductor when the buck goes to discontinuous mode. The charging/discharging operations make the pair Q2 420 and Q4 424 act as a pseudo capacitor with a capacitance value controlled by a controller, where the capacitance is proximately determined by:

$$K1*Ic+K2*ILOAD+K3*(Vin-Vout)+K4*Rds2+K5*Rds4+K6*IL$$

Ic is the output capacitor current; IL is the inductor current; K1,K2,K3,K4,K5,K6 are the gain factors; ILOAD is the load current; Rds2 is the total resistance from switching node to Vin and Rds4 is the total resistance from the switching node to ground.

In pseudo multi-phase mode, the system needs only 1 inductor versus N inductors. The multi-phase is achieved by over-sampling the Vout while keeping the same switching frequency.

Figure 4A:
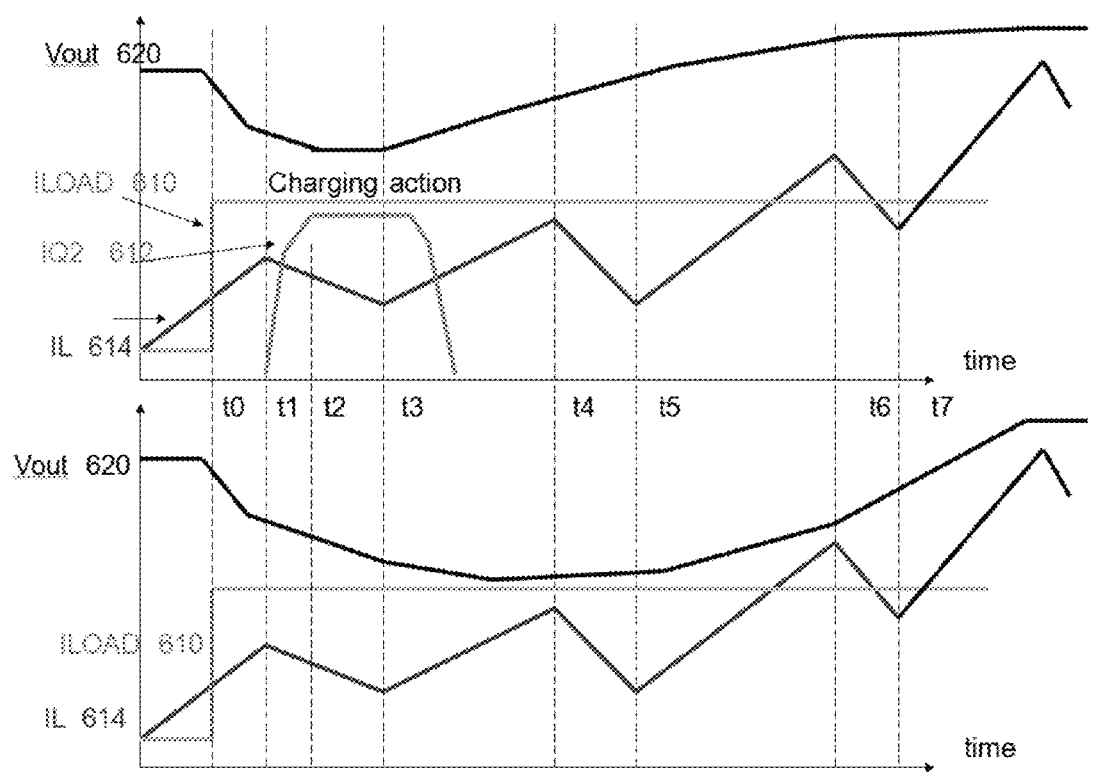
FIGS. 4A-4B show exemplary graphs illustrating the operations of the system of FIG. 2.
Figure 4B:
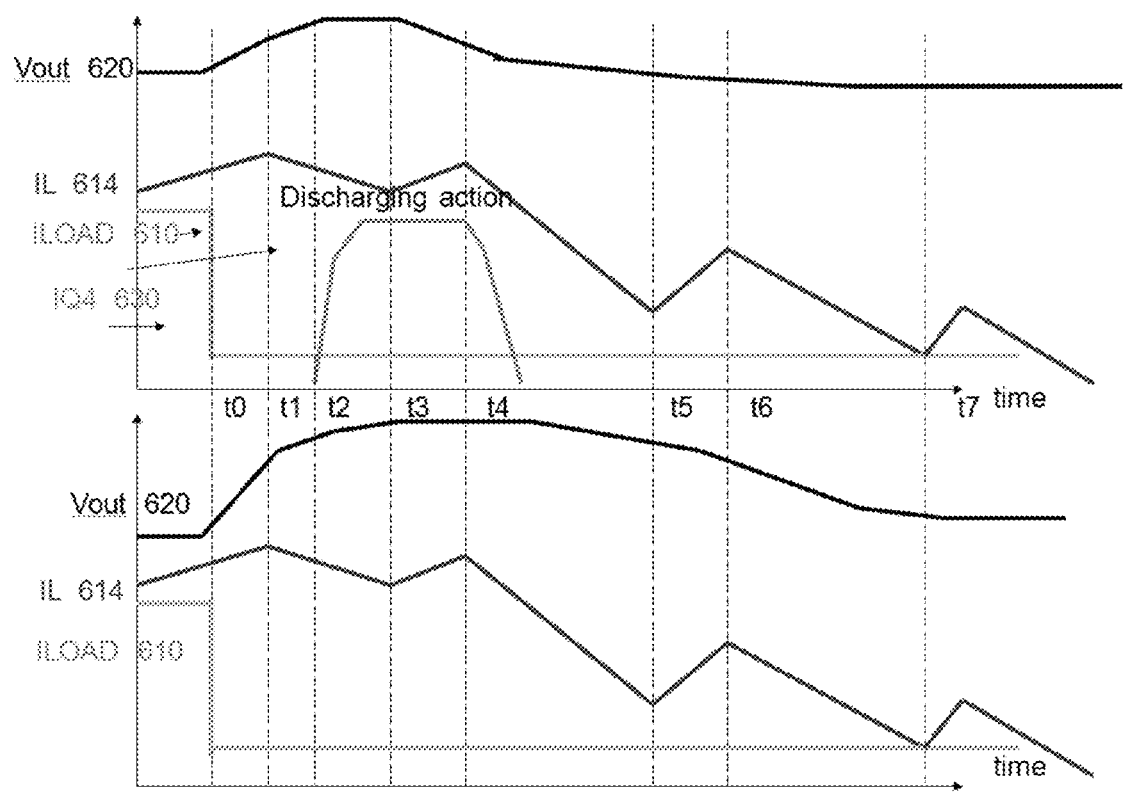

FIGS. 4A-4B show exemplary graphs illustrating the operations of the system of FIG. 2. At the top FIG. 4A, ILOAD 610 is turned on at time t0 to drive a charging action and cause the inductor current IL 614 to ramp up. The current at Q2 IQ2 612 is on from period t1 until period t3. This causes the output voltage Vout 620 to drop in period t0 to the lowest point at period t2 and increases thereafter. At the bottom of FIG. 4A, IQ2 612 is not on, and Vout 620 reaches its lowest value during period t3 and then increases.

Referring now to FIG. 4B, a corresponding graph illustrating a discharging action is shown. At period t0, ILOAD 610 is turned off to drive a discharging action. The inductor current IL 614 ramps down after period t0. The current at Q4 IQ4 630 is on from period t1 until period t3. This causes the output voltage Vout 620 to increase and to peak at period t2 and flattens out thereafter. At the bottom of FIG. 4B, IQ4 630 is not on, and Vout 620 reaches its highest value during period t3 and then falls back to its normal level.

The pseudo four phase buck regulator advantage is that it uses only one inductor rather than four inductors. Since inductors take up significant chip real estate, the pseudo four phase buck converter can be implemented with ease for monolithic implementation (especially for DrMos) and at a lower cost.

In yet another implementation, upper transistors Q1 410 and Q2 420 can operate from different input voltages to allow the buck controller to have greater than 100% duty cycle. Each upper switch is controlled by one of unique upper driver signals HDRV1 and HDRV2, which can be generated by a multiplexer from a master upper driver signal HDRV. With a duty cycle greater than 100%, the controller is able to respond faster because the effective inductor is smaller when Q2 is on. To facilitate higher voltage on Vin2, a simple bootstrap circuit can be used to generate the supply voltages internally. The system can also balance current among the transistors. If the switch with the current exceeds a pre-defined threshold, Q2 will not turn on and loop gain is reduced. Thus, the inductor current in this switch is limited while other switch currents are allowed to increase. Soon other transistors will take over as highest current one and become current limited by the digital controller. Current shedding can be done by setting the loop gain to a very low value which will reduce the inductor current over time to a pre-defined value.

The above system provides the digital controller implementation with much greater flexibility and better utilization of switching power converters. The second switching circuit is small and they are activated for only a few cycles, so they allow smaller inductor to be used, which in turn allows quick response without high current ripple and voltage ripple. Further, the system can implement a pseudo multi-phase buck regulator requiring only one inductor rather than a plurality of inductors. Since inductors take up significant chip real estate, the pseudo four phase buck converter can be implemented with ease for monolithic implementation (especially for DrMos) and at a lower cost. Further, the current in a multiphase regulator can be balanced with precision.

Although the examples given above describe a dynamic charge/discharge circuit in fast transient Buck regulators, one skilled in the art will appreciate that the technique can be applied to other circuit functions for operation in similar fashion. It will be understood from the foregoing description that various modifications and changes may be made in the preferred and alternative embodiments of the present invention without departing from its true spirit. For example, the multiplexer can be a look up table, or the FETs may be implemented using MOS transistors, bipolar transistors, or other suitable switching devices, the circuit may include a subset or superset of the elements described in the examples above, the method may be performed in a different sequence, the components provided may be integrated or separate, the devices included herein may be manually and/or automatically activated to perform the desired operation.

This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. A buck converter, comprising:
   a. a first switching circuit including a first upper power transistor coupled to a first lower power transistor at a first junction;
   b. a second switching circuit including a second upper power transistor coupled to a second lower power transistor at a second junction, wherein the second upper power transistor has an on time T determined by K1*Ic+K2*ILOAD+K3*(Vin−Vout)+K4*Rds2+K5*Rds4+K6*IL, where Ic is the output capacitor current; IL is the inductor current; K1,K2,K3,K4,K5,K6 are the gain factors; ILOAD is the load current; Rds2 is the total resistance from switching node to Vin and Rds4 is the total resistance from the switching node to ground;
   c. an inductor coupled to the first and second junctions; and
   d. a load coupled to the second junction.

2. The buck converter of claim 1, wherein the second upper power transistor turns on when an output voltage falls below a predetermined voltage.

3. The buck converter of claim 1, wherein the second lower power transistor turns on when an output voltage exceeds a predetermined voltage.

4. The buck converter of claim 1, wherein the second switching circuit is activated with fewer switching cycles than the cycles of the first switching circuit and wherein the first switching circuit handles higher current than the second switching circuit.

5. The buck converter of claim 1, wherein the first and second switching circuits perform pseudo-multiphase Buck regulation.

6. The buck converter of claim 5, wherein the pseudo-multiphase Buck regulation requires only one inductor regardless of phases.

7. The buck converter of claim 5, wherein the inductor is on-chip.

8. The buck converter of claim 1, comprising a control loop having a slow loop to control the first switching circuit and a fast loop to control the second switching circuit, wherein the slow loop has high priority over the fast loop.

9. The buck converter of claim 1, comprising a first body diode coupled to the first upper power transistor and a second body diode coupled to the first lower power transistor.

10. A method to control a buck converter, comprising:
   a. dynamically charging or discharging an inductor with a first switching circuit including a first upper power transistor coupled to a first lower power transistor at a first junction and a second switching circuit including a second upper power transistor coupled to a second lower power transistor at a second junction, wherein the second upper power transistor has an on time T determined by $K1*Ic+K2*ILOAD+K3*(Vin-Vout)+K4*Rds2+K5*Rds4+K6*IL$, where Ic is the output capacitor current; IL is the inductor current; K1,K2,K3,K4,K5,K6 are the gain factors; ILOAD is the load current; Rds2 is the total resistance from switching node to Vin and Rds4 is the total resistance from the switching node to ground; and
   b. providing power to a load coupled to the inductor.

11. The method of claim 10, comprising turning on the second upper power transistor when an output voltage falls below a predetermined voltage.

12. The method of claim 10, comprising turning on the second lower power transistor when an output voltage exceeds a predetermined voltage.

13. The method of claim 10, wherein the second switching circuit is activated less frequently than the first switching circuit and wherein the first switching circuit handles higher current than the second switching circuit.

14. The method of claim 10, comprising performing pseudo-multiphase buck regulation with the first and second switching circuits.

15. The method of claim 14, wherein the pseudo-multiphase buck regulation requires only one inductor regardless of multi-phase operation.

16. The method of claim 14, comprising providing a control loop with a slow loop to control the first switching circuit and a fast loop to control the second switching circuit, wherein the slow loop has high priority over the fast loop.

17. The method of claim 10, wherein the second upper power transistor on time is closed to a peak inductor current to ensure a charging current at a load and wherein the second lower power transistor is closed to a valley current in the inductor to discharge current to ground and prevent negative current in the inductor in a discontinuous buck mode.

18. A method to control a buck converter, comprising:
   a. dynamically charging or discharging an inductor with a first switching circuit including a first upper power transistor coupled to a first lower power transistor at a first junction and a second switching circuit including a second upper power transistor coupled to a second lower power transistor at a second junction;
   b. providing power to a load coupled to the inductor; and
   c. charging and discharging the second upper and lower power transistors to simulate a capacitor with a capacitance of $K1*Ic+K2*ILOAD+K3*(Vin-Vout)+K4*Rds2+K5*Rds4+K6*IL$
   where Ic is an output capacitor current; IL is an inductor current; K1,K2,K3,K4,K5,K6 are gain factors; ILOAD is a load current; Rds2 is a total resistance from switching node to Vin and Rds4 is a total resistance from the switching node to ground.

* * * * *